United States Patent [19]
Kamo et al.

[11] 4,034,394
[45] July 5, 1977

[54] SCHOTTKY SEMICONDUCTOR DEVICE

[75] Inventors: Hisao Kamo, Yokohama; Masahiro Kuroda, Tokyo; Susumu Okano, Yokohama, all of Japan

[73] Assignee: Tokyo Shibaura Electric Co., Ltd., Tokyo, Japan

[22] Filed: Apr. 13, 1976

[21] Appl. No.: 676,493

[30] Foreign Application Priority Data
Apr. 16, 1975 Japan .................. 50-45168

[52] U.S. Cl. .................. 357/15; 357/56; 357/71; 357/61
[51] Int. Cl.² .................. H01L 29/48; H01L 29/06; H01L 29/161; H01L 23/48
[58] Field of Search .................. 357/15, 56, 71, 61

[56] References Cited
UNITED STATES PATENTS

| | | | |
|---|---|---|---|
| 3,616,380 | 10/1971 | Lepselter | 357/15 |
| 3,636,417 | 1/1972 | Kimura | 357/15 |
| 3,886,580 | 5/1975 | Calviello | 357/15 |

*Primary Examiner*—Edward J. Wojciechowicz
*Attorney, Agent, or Firm*—Finnegan, Henderson, Farabow & Garrett

[57] ABSTRACT

A Schottky semiconductor device includes a gallium arsenide substrate, a first metal layer formed of niobium, tantalum or vanadium to define a Schottky junction with the substrate, a second metal layer of platinum or palladium formed on the first metal layer and a third metal layer superposed on said second metal layer.

4 Claims, 4 Drawing Figures

SCHOTTKY SEMICONDUCTOR DEVICE

BACKGROUND OF THE INVENTION

This invention relates to a Schottky diode and more particularly to a semiconductor device, the substrate of which is formed of gallium arsenide.

The above-mentioned type of diode is widely accepted in the form of an IMPATT diode, mixer diode or varacter diode operated in microwave or milliwave frequencies. The barrier metal used with the prior art Schottky diode is generally formed of a transition metal such as titanium (Ti), molybdenum (Mo), platinum (Pt) or chromium (Cr). The conventional Schottky barrier prepared from any of the above-listed transition metals has the drawbacks that when the Schottky diode has a higher internal temperature than 250° C, then the barrier is reduced in height and the $n$ value of the forward characteristics of the Schottky diode is increased due to said high reduction of the barrier acting as one of the causes, thereby resulting in the deterioration of the property of said diode as a whole. The above mentioned type of Schottky diode has its internal temperature often raised above 250° C during operation, giving rise to a decline in this property and in its effective life. With the IMPATT diode, for example, the Schottky barrier temperature unavoidably rises to aroung 250° C when a high voltage is applied, even under the condition in which a device is provided to decrease heat resistance as much as possible. While the IMPATT diode is used continuously for long hours, the barrier is gradually reduced in height, leading to a decline in the oscillation characteristics of the diode.

SUMMARY OF THE INVENTION

It is accordingly the object of this invention to provide a Schottky semiconductor device whose property is little deteriorated even when its internal temperature is appreciably raised by heat resistance, namely, whose Schottky barrier or junction is rendered thermally stable.

The fact that the Schottky junction of the prior art Schottky semiconductor device is very adversely affected by heat resistance is assumed to orginate with the unadapted property or metals forming the Schottky junction. Based on this assumption, experiments have been conducted with the object of eliminating this drawback, disclosing that application of niobium, tantalum of vanadium as a Schottky barrier metal will serve the purpose. It has actually been proved that any of these proposed metals is thermally stable, and that a Schottky barrier formed of any of such metals is little deteriorated in property even when heated continuously for long hours at as high a temperature as, for example, 500° C. Yet, a Schottky diode whose Schottky barrier was formed of any of the above-mentioned proposed metals failed to provide a good Schottky junction, where etching was included in the manufacturing process. For instance, a mesa IMPATT diode whose Schottky barrier was prepared from any of said proposed metals was destroyed when only supplied with direct input power of 1 to 4 [W] and substantially ceased to carry out oscillation.

The present inventors have conducted many experiments and studies in view of the foregoing difficulties accompanying the last mentioned Schottky semiconductor devices, and have found that the problem is not the metals constituting the Schottky junction, but rather a second metal layer mounted on said Schottky barrier metals. It has been disclosed that where a single crystal body is formed of, for example, an $n^+$ type GaAs substrate and an $n$ type GaAs layer epitaxially grown on said substrate, a gold-germanium alloy layer and gold layer are mounted on the upper side of said single crystal body, and a niobium layer, silver layer and gold layer are laminated on the underside of said GaAs single crystal body in the order mentioned as counted from said underside and the GaAs single crystal body is etched in the maser form with the Au-Ge and Au layers used as a mask, then that portion of the GaAs single crystal body which contacts the Nb layer has its peripheral edge undesirably etched to exert a very harmful effect on the property of a Schottky diode as a whole. An attempt was made to use other metals than niobium, for example, tantalum or vanadium as a Schottky junction metal. Nevertheless, the Schottky junction of the GaAs single crystal body was still undesirably etched. Where, however, a second metal layer or blocking layer was formed of platinum or palladium instead of silver to provide a Schottky diode, then it was confirmed that even if the first metal layer was prepared from niobium, tantalum or vanadium, the Schottky junction, namely, that portion of the GaAs single crystal body which contacted said first metal layer was not eroded by etching.

DESCRIPTION OF THE PREFERRED EMBODIMENT

Figure 1:
FIGS. 1 to 4 are sectional views showing the sequential steps of manufacturing a Schottky semiconductor device embodying this invention.
Figure 2:
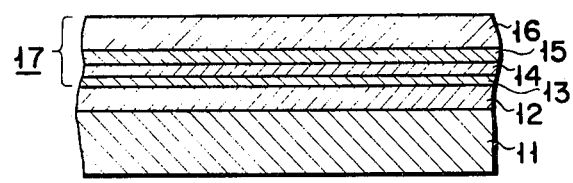
Figure 3:
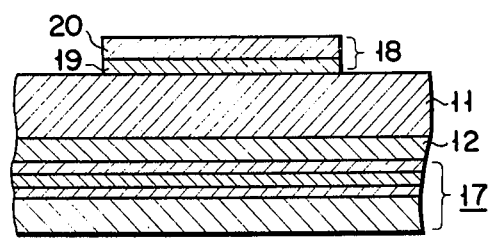
Figure 4:
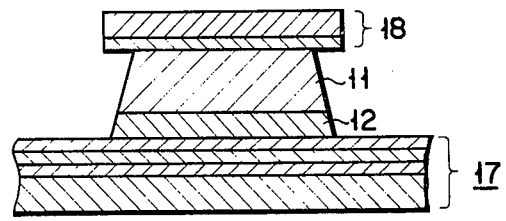

There will now be described by reference to the appended drawing an IMPATT diode embodying this invention and the method of manufacturing the same. First, as illustrated in FIG. 1, an $n$ type GaAs layer 12 is epitaxially grown in vapour phase at a donor concentration of about $7 \times 8 \times 10^{15}/cm^3$ and to a thickness of about 15 microns on an $n^+$ type GaAs substrate 11 formed at a donor concentration of $5 \times 10^{18}/cm^3$ and to thickness of about 300 microns to provide a GaAs single crystal body. Since the GaAs substrate 11 generally has a low crystallinity, the above-mentioned $n$ type GaAs layer 12 should preferably be deposited by the so-called double epitaxial growth method. According to this double epitaxial growth method, a first $n$ type GaAs layer is formed on the $n^+$ type GaAs substrate 11 at a donor concentration of, for example, about $5 \times 10^{17}/cm^3$ and to a thickness of about 7 to 8 microns. Thereafter, a second $n$ type GaAs layer is epitaxially grown on the first $n$ type GaAs layer with the amount of a donor changed to provide an $n$ type GaAs body 12. Next, vanadium is vacuum evaporated on the $n$ type GaAs layer 12 to a thickness of about 3000 A units to provide a Schottky junction metal layer or first metal layer 13. As the result, a Schottky junction is formed between the $n$ type GaAs layer 12 and metal layer 13. A platinum blocking layer or second metal layer 14 is mounted on the first metal layer 13 to a thickness of about 1500 A units. Thereafter, gold is vacuum evaporated on the second platinum blocking layer 14 to a thickness of about 5000 A units to provide a third metal layer 15. Next, gold is plated on the gold layer 15 to a thickness of about 100 microns to provide a fourth metal layer 16 to be used as a heat sink. Thus, one electrode assembly 17 is deposited, as shown in FIG. 2, on one side of the GaAs layer 12. Another electrode assembly 18 is formed on the opposite side of the GaAs body to said one electrode assembly 17 by vacuum evaporating an Au-Ge alloy 19 on the $n^+$ type GaAs substrate 11 to a thickness of about 3000 A units and further plating a gold layer 20 on said Au-Ge alloy 19 to a thickness of about 10 microns. Said electrode assembly 18 is selectively etched to remove, as shown in FIG. 3, its peripheral edge portion. Last, the GaAs body is etched in the maser form whose cross section is tapered as illustrated in FIG. 4 with the etched electrode assembly 18 used as a mask. An etchant used in this case may consist of a type already known in the field of etching gallium arsenide, for example, a type of $H_2SO_4$—$H_2O_2$ system, or otherwise a bromine solution.

With a Schottky semiconductor device according to the above-mentioned embodiment in which the blocking layer 14 is formed of platinum, even treatment of the GaAs body 12 by an etchant in the maser form does not cause the effective Schottky junction to be reduced in size due to the erosion by the etchant of the peripheral edge of that portion of the GaAs body which contacts the first metal layer 13. Unlike, therefore, the prior art IMPATT diode using a blocking layer prepared from, for example, silver, the Schottky semiconductor device of this invention can be operated under a stable condition even when supplied with a larger D.C. input than 10W. Since, with this invention, the Schottky junction metal layer is formed of vanadium, the property of said junction is not deteriorated when exposed to as high a temperature as 500° C continuously for long hours.

With the above-mentioned embodiment, the first metal layer was formed of vanadium. However, application of niobium, tantalum or alloy thereof as said first metal layer renders the resultant Schottky semiconductor device thermally stable all the same. A palladium blocking layer can prevent the erosion of the GaAs body by an etchant as effectively as a platinum type. Obviously, this invention is not limited to the IMPATT type of Schottky semiconductor device, but may also be applicable to any other type which requires the GaAs body to be etched during the manufacturing process.

What we claim is:

1. A Schottky semiconductor device which comprises a GaAs single crystal body, said GaAs single crystal body being of a mesa shape; a first metal layer formed of at least one selected from the group consisting of niobium, tantalum and vanadium and mounted on one side of the GaAs single crystal body to provide a Schottky junction between said first metal layer and GaAs single crystal body, a second metal layer prepared from at least one selected from the group consisting of platinum and palladium and deposited on said first metal layer; and a third metal layer formed of gold and provided on said second metal layer.

2. The Schottky semiconductor device according to claim 1, wherein the GaAs single crystal body comprises a GaAs substrate containing a high concentration of impurity; and a GaAs layer of low impurity concentration deposited on said GaAs substrate and provided with said first metal layer.

3. The Schottky semiconductor device according to claim 1, wherein the GaAs single crystal body further has an electrode layer mounted on the other side of said body.

4. The Schottky semiconductor device according to claim 1, wherein the third metal layer is formed of a gold layer on the second metal layer and a heat sink gold layer plated on said vapor deposited gold layer to a larger thickness than said vapor deposited gold layer.

* * * * *

UNITED STATES PATENT AND TRADEMARK OFFICE
CERTIFICATE OF CORRECTION

PATENT NO. : 4,034,394
DATED : July 5, 1977
INVENTOR(S) : Hisao Kamo, Masahiro Kuroda & Susumu Okano It is certified that error appears in the above-identified patent and that said Letters Patent are hereby corrected as shown below:

Claim 4, column 4, line 33, after "of a "

insert --vapor deposited--.

Signed and Sealed this

Twenty-seventh Day of September 1977

[SEAL]

Attest:

RUTH C. MASON
*Attesting Officer*

LUTRELLE F. PARKER
*Acting Commissioner of Patents and Trademarks*